US006617266B2

United States Patent
Nickles et al.

(10) Patent No.: US 6,617,266 B2
(45) Date of Patent: Sep. 9, 2003

(54) BARIUM STRONTIUM TITANATE ANNEALING PROCESS

(75) Inventors: Annabel Susan Nickles, Palo Alto, CA (US); Ravi Rajagopalan, Sunnyvale, CA (US); Pravin Narwankar, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/834,698

(22) Filed: Apr. 12, 2001

(65) Prior Publication Data

US 2002/0173126 A1 Nov. 21, 2002

(51) Int. Cl.$^7$ .................. H01L 21/31; H01L 21/469; H01L 21/8242
(52) U.S. Cl. .................... 438/785; 438/240
(58) Field of Search ............... 438/240, 386, 438/393, 396, 250, 502, 785

(56) References Cited

U.S. PATENT DOCUMENTS

| 5,453,908 | A | | 9/1995 | Tsu et al. ............... 361/321.5 |
| 5,617,290 | A | | 4/1997 | Kulwicki et al. ........ 361/321.4 |
| 5,635,741 | A | | 6/1997 | Tsu et al. ................ 257/310 |
| 5,731,220 | A | | 3/1998 | Tsu et al. ................ 437/60 |
| 5,783,253 | A | | 7/1998 | Roh ...................... 427/81 |
| 5,940,676 | A | | 8/1999 | Fazan et al. ................ 438/3 |
| 5,940,677 | A | | 8/1999 | Yamauchi et al. ............ 438/3 |
| 5,943,580 | A | * | 8/1999 | Ramakrishnan ............ 438/381 |
| 5,973,911 | A | | 10/1999 | Nishioka ................ 361/313 |
| 5,998,258 | A | | 12/1999 | Melnick et al. ............ 438/253 |
| 6,130,102 | A | * | 10/2000 | White, Jr. et al. ............ 438/3 |
| 6,162,744 | A | * | 12/2000 | Al-Shareef et al. ......... 438/785 |
| 6,204,203 | B1 | * | 3/2001 | Narwankar et al. ......... 438/785 |
| 6,265,260 | B1 | * | 7/2001 | Alers et al. ................ 438/240 |
| 6,274,424 | B1 | * | 8/2001 | White et al. ............. 438/239 |
| 6,329,237 | B1 | * | 12/2001 | Kim et al. ............... 438/240 |
| 6,348,373 | B1 | * | 2/2002 | Ma et al. ................ 438/240 |
| 6,475,854 | B2 | * | 11/2002 | Narwankar et al. ......... 438/238 |
| 2002/0030222 | A1 | * | 3/2002 | Agarwal .................. 257/310 |
| 2002/0064970 | A1 | * | 5/2002 | Chooi et al. ............. 438/785 |

* cited by examiner

Primary Examiner—Richard Elms
Assistant Examiner—Beth E. Owens
(74) Attorney, Agent, or Firm—Law Office of Alan W. Cannon

(57) ABSTRACT

A process for forming high k dielectric thin films on a substrate, e.g., silicon, by 1) low temperature (500° C. or less) deposition of a dielectric material onto a surface, followed by 2) high temperature post-deposition annealing. The deposition can take place in an oxidative environment, followed by annealing, or alternatively the deposition can take place in a non-oxidative environment (e.g., $N_2$), followed by oxidation and annealing.

13 Claims, 6 Drawing Sheets

BARIUM STRONTIUM TITANATE ANNEALING PROCESS

FIELD OF THE INVENTION

The present invention relates to the use of low temperature deposition of a high K dielectric material with post deposition annealing.

BACKGROUND OF THE INVENTION

A dynamic random access memory (DRAM) cell typically comprises a charge storage capacitor (or cell capacitor) coupled to an access device, which functions to apply or remove charge on the capacitor, thus affecting a logical state defined by the stored charge. The amount of charge stored on the capacitor is determined by the capacitance, C=epsilonA/d, where epsilon is the dielectric constant of the capacitor dielectric, A is the electrode (or storage node) area and d is the interelectrode spacing. The conditions of DRAM operation such as operating voltage, leakage rate and refresh rate, in general mandate that a certain minimum charge be stored by the capacitor.

The capacitance of a memory cell capacitor is proportional to the surface area A of the opposing electrodes, and proportional to the dielectric constant of the dielectric layer between the opposing electrodes. The capacitance of the memory cell capacitor is inversely proportional to the distance between the opposing electrodes. As dynamic random access memory devices become more highly integrated, space available for each memory cell is reduced, and more particularly, the space available for each memory cell capacitor is reduced. The reduced area available for a capacitor in turn leads to reduced surface area of the opposing electrodes, thereby reducing the capacitance of the memory cell capacitor. Reductions in memory cell capacitance, however, may reduce the performance of the integrated circuit memory device. Accordingly, there exists a need to maintain a predetermined memory cell capacitance despite reductions in memory cell capacitor size.

Three basic techniques have been developed to increase memory cell capacitance without increasing the size of the memory cell capacitor. First, the dielectric layer between the opposing electrodes can be made thinner. Second, a dielectric material having a relatively high dielectric constant can be provided between the opposing electrodes. Third, the surface area of the opposing electrodes can be increased.

Recently, for example, a great deal of attention has been given to the development of thin film dielectric materials that possess a dielectric constant significantly greater (>10×) than the conventional dielectrics, such as silicon oxides or nitrides, used in conventional manufacture. Particular attention has been paid to Barium Strontium Titanate (BST), Barium Titanate (BT), Lead Zirconate Titanate (PZT), Tantalum Pentoxide ($Ta_2O_5$) and other high dielectric constant materials as a cell dielectric material of choice for DRAMs. These materials, in particular BST, have a high dielectric constant and low leakage currents, which makes them very attractive for high density memory devices.

To be useful dielectrics, the dielectric layers must have proper crystallization to realize the high-K properties. In the case of BST thin films, this is generally achieved by high temperature deposition and annealing of the BST films. Most conventional processes for obtaining favorable BST crystallization require lengthy furnace anneals, and are not very cost effective. In addition, high temperature deposition does not reproducibly provide adequate step coverage of the BST onto the underlying substrate.

There is thus a need in the art for a method of dielectric material deposition that provides both proper crystallization of the dielectric material and adequate step coverage of the substrate.

SUMMARY OF THE INVENTION

The present invention provides a means for obtaining high-K dielectric thin films on a substrate, e.g., silicon, by 1) low temperature (500° C. or less) deposition of a dielectric material onto a surface, followed by 2) high temperature (over 500° C.) post-deposition annealing. The deposition can take place in an oxidative environment, followed by annealing, or alternatively the deposition can take place in a non-oxidative environment (e.g., $N_2$), followed by oxidation and annealing.

In one embodiment, the invention provides a method for manufacturing an electrode using a two-step process for depositing and annealing the dielectric layer of the capacitor. The first step is a low temperature deposition that allows proper step coverage of the bottom electrode, i.e., providing a layer with substantially consistent thickness and conformity over the features forming the bottom electrode. This is then followed by annealing at a high temperature to provide proper crystallization of the dielectric materials, resulting in a layer of material having a high dielectric constant.

In another embodiment, the invention provides a DRAM capacitor having a dielectric layer formed using two-step process to create a high-K dielectric layer having both adequate step coverage and proper crystallization. Preferably, the capacitor is a MIM DRAM capacitor, with a dielectric layer formed between two metal electrodes, preferably, the dielectric layer is barium strontium titanate.

In yet another embodiment, the invention provides a capacitor within a integrated circuit composed of a first electrode, a dielectric layer annealed to said first electrode, and a second electrode covering said dielectric layer. The second electrode may be directly in contact with the dielectric layer, or may be in contact with another layer over said dielectric layer. The dielectric layer is formed using the two-step process to create a high-K dielectric layer having both adequate step coverage and proper crystallization.

In yet another embodiment, the invention provides a method of fabricating a MIM DRAM capacitor by depositing and annealing a dielectric material having a dielectric constant of at least 200–400 onto a platinum film, and covering the dielectric material with a second electrode.

Yet another embodiment of the invention provides a semiconductor device having a capacitor formed on an insulated surface of the semiconductor substrate. The capacitor has a pair of electrodes, with a dielectric layer between the electrodes, preferably a dielectric layer composed of a material having a dielectric constant of at least 300. The dielectric layer is deposited and annealed using the two step process of the present invention. An interconnection layer operatively connects one of the electrodes to the semiconductor integrated circuit.

It is an aspect of the present invention to provide a thin film of a dielectric material such as BST which provides low leakage characteristics for a capacitor of small size and high electrostatic capacity.

It is an object of the invention to provide a suitable substrate for deposition of dielectric materials such as BST.

An advantage of the present invention is that the dielectric layer displays both adequate step coverage and proper crystallization.

An advantage of the present method is that it shortens processing times compared to conventional methods of forming high-K dielectric layers.

Another advantage of the present method is that is conserves thermal budgets.

These and other objects, advantages, and features of the invention will become apparent to those persons skilled in the art upon reading the details of the methods as more fully described below.

DETAILED DESCRIPTION OF PREFERRED EMBODIMENTS

Figure 1:
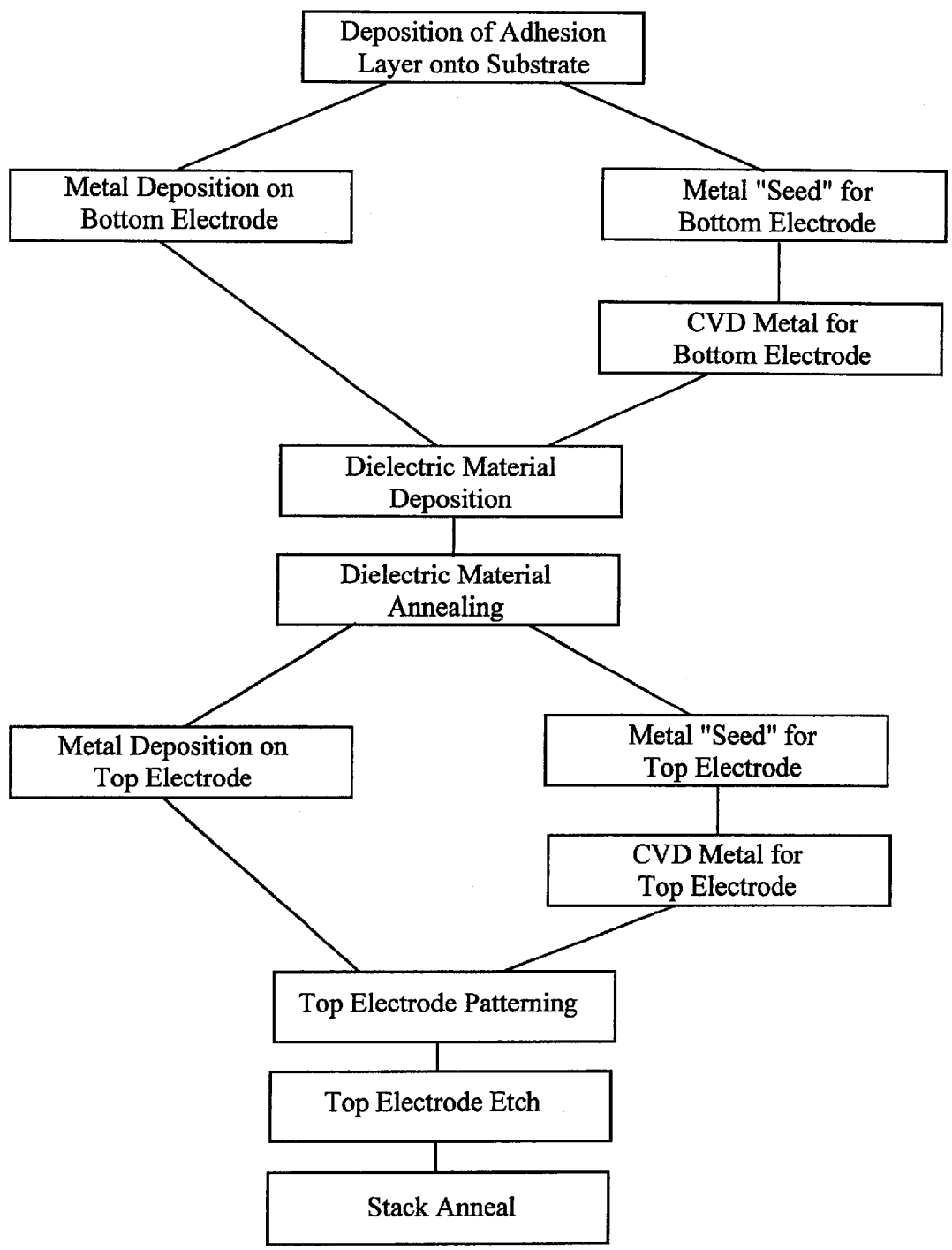
FIG. 1 is a schematic chart showing the steps in the production of a MIM DRAM capacitor.

Before the present methods are described, it is to be understood that this invention is not limited to particular parameters described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "and", and "the" include plural referents unless the context clearly dictates otherwise. Thus, for example, reference to "a dielectric material" includes a plurality and/or combination of such materials and reference to "the annealing process" includes reference to one or more such processes and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

The term "substrate" as used herein refers to a foundation or supporting base material on which an integrated circuit is fabricated. In particular, the term "substrate" when used in reference to the present invention refers to a material such as a Si wafer upon which an electrode can be formed. A preferred substrate is a thermally oxidized silicon wafer of the type used in connection with electronic components which is (1) conducting, (2) chemically inert, and (3) oxidation resistant.

The term "dielectric" as used herein refers to a material in which an electric field can be maintained with zero or near-zero power dissipation, i.e., the electrical conductivity is zero or near zero.

The term "capacitor" as used herein refers to a passive electronic component that stores energy in the form of an electrostatic field. In its simplest form, a capacitor consists of two conducting plates, or electrodes, separated by a dielectric layer.

The term "dynamic random access capacitor" and "DRAM capacitor" as used interchangeably herein refer to a capacitor for a memory system that is dynamic in that, unlike static RAM (SRAM), it needs to have its storage cells refreshed or given a new electronic charge every few milliseconds.

The term "integrated circuit" as used herein refers to an electronic circuit having multiple individual circuit elements, such as transistors, diodes, resistors, capacitors, inductors, and other active and passive semiconductor devices, formed on a single chip of semiconducting material and mounted on a single piece of substrate material.

The term "high-K dielectric material" as used herein refers to a dielectric material with a dielectric constant of at least 10, more preferably a material having a dielectric constant of at least 100, even more preferably a material having a dielectric constant of at least 200–400 and as high as about 1000. This term is intended to encompass dielectric materials including, but not limited to, $Ta_2O_5$, $HfO_2$, PZT SBT SRO ZnO ZrO and $CeO_2$ and BST.

The terms "high temperature anneal", "high temperature post-deposition annealing process" and the like as used herein refer to annealing processes of about 500 to 800° C., more preferably temperatures between 600 to 750° C., and even more preferably temperatures of at least 650° C. to 750° C.

The following abbreviations are used throughout the specification:
PVD is used for physical vapor deposition.
MIM is used for metal-insulator-metal.
DRAM is used for dynamic random access memory.
Si is used for Silicon.
BST is used for Barium Strontium Titanate.
BT is used for Barium Titanate.
Pt is used for Platinum.
Ru is used for Ruthenium.
Ir is used for Iridium.
$Ta_2O_5$ is used for Tantalum Pentoxide.

PZT is used for Lead Zirconate Titanate.
HfO$_2$ is used for Haffium Oxide.
SBT is used for SrBi$_2$Ta$_2$O$_9$.
SRO is used for Strontium Oxide.
ZnO is used for Zinc Oxide.
ZrO$_2$ is used for Zirconium Oxide.
CeO$_2$ is used for Cerium Oxide.
TiO$_2$ is used for Titanium Oxide.
RIE is used for reactive ion etching.
RTP is used for rapid thermal processing.
RPO is used for remote plasma oxidation.

General Aspects of the Invention

The present invention provides a method for improved manufacture of capacitors, and in particular improved dielectric deposition in the production of metal-insulator-metal (MIM) DRAM capacitors. A general, exemplary method for production of a MIM DRAM capacitor is illustrated schematically in FIG. 1.

In the method as illustrated in FIG. 1, the production of the capacitor first involves the creation of an adhesion and/or barrier layer, e.g., the PVD deposition of TiAlN or TiO$_2$, on a substrate. Following the application of the adhesion layer, a bottom electrode comprising metal is formed on the substrate. This can be done, for example, by deposition of a metal such as platinum (Pt), ruthenium (Ru) or iridium (Ir) on the adhesion layer using PVD. PVD can be cared out, for example, in an Endura PVD chamber (Applied Materials, Santa Clara, Calif.). The metal electrode layer is preferably from about 100–2000 Å in thickness, and more preferably 300–1000 Å in thickness.

In another example, the electrode can be formed by depositing a metal "seed" onto the adhesion layer, followed by a subsequent deposition of the same metal using CVD to create a CVD "bulk" film. The CVD can be carried out in a conventional CVD electrode chamber.

The deposition ambient for the electrode is generally inert, although it may be oxidizing for in situ oxide layer formation. These depositions are optionally followed by annealing of the metal. The anneal may take place for a period of time ranging from a few seconds to several minutes at a temperature ranging from about 200° C. to about 800° C.; the pressure may vary from between few milliTorr to 1 atm. In a preferred embodiment, the anneal take place for 2 minutes at 450° C. and 2.5 Torr using remote plasma anneal. The ambient is preferably inert, an inert oxygen mixture, or 100% oxygen. The annealing may take place in any chamber in which a plasma can be generated or to which a remote plasma generator can be attached. In one embodiment, the annealing takes place in an XZ RPA chamber, which is a modified CVD chamber available from Applied Materials, Santa Clara, Calif.

Figure 6:
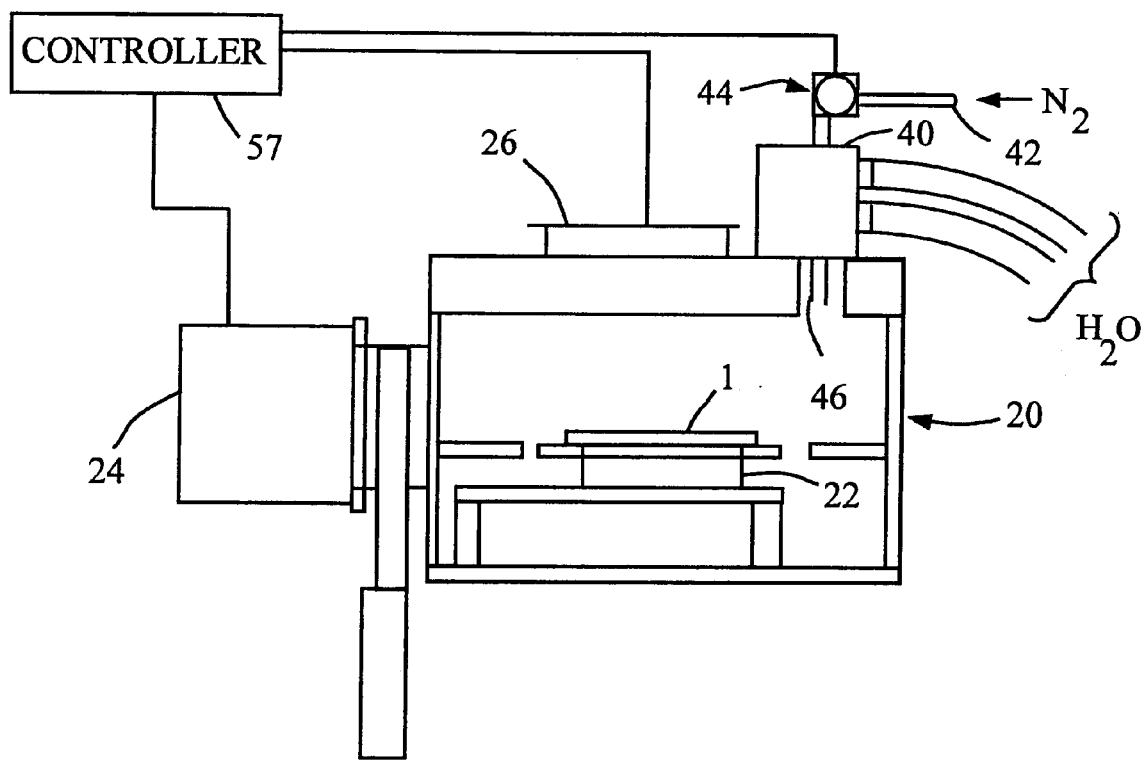
FIG. 6 is a schematic representation of an anneal chamber including a remote cavity for the remote generation of a plasma to carry out a processes according to the present invention.

FIG. 6 shows a chamber 20, which may be an anneal chamber, such as the Applied Materials XZ Anneal Chamber, for example, which may be used in carrying out the present invention. It is noted that the present invention is not limited by the chamber described with regard to FIG. 6, but may be carried out in other chambers, including other CVD systems used with the Endura system manufactured and sold by Applied Materials, Inc. of Santa Clara, Calif., RTP chambers used with the Centura mainframe of Applied Materials, and other chambers including those used in PVD, CVD, PECVD, RPECVD and RTPCVD processes.

Chamber 20 is a vacuum tight chamber, and may be made of aluminum, for example. A susceptor 22 is situated in the chamber 20. Susceptor 22 may also be made of aluminum, and functions to support the substrate during processing. At the top of the chamber 20 is a heater 26, such as a microwave powered heating unit. Heater 26 irradiates the inside of chamber 20 and susceptor 22 to heat susceptor 22 and the environment of the chamber 20 thereby heating the substrate to an appropriate process temperature and maintaining it in a desired temperature range. Additionally or alternatively, the susceptor may have built in resistive heating, as is known in the art.

A vacuum pump system 24 is connected to the chamber 20 and produces and maintains the required vacuum conditions in the chamber for processing. A remote chamber 40, which may be water-cooled, is mounted to chamber 20, on top of chamber 20 in this example, although a side mount may also be possible. Chamber 40 is used to remotely excite or activate a corresponding process gas, e.g., by forming a plasma, prior to flowing the excited process gas into chamber 20 and over the substrate 1 to react therewith. In the above-mentioned example, chamber 40 receives an inert, inert plus oxygen, or other oxygen containing gas to carry out a remote plasma anneal or remote plasma oxidation and anneal process. The gas or gases flow through a supply line 42 that is controlled by a pulse valve 44, or other valve mechanism suitable for this purpose. The pulse valve 44 may be a solenoid or piezoelectric valve. Chamber 40 supplies activated species into chamber 20 through injection port 46, mounted through the lid of the chamber 20. Chamber 40 is used to generate a remote plasma with the inputted gas or gases, to activate the species before it is flowed into the chamber 20.

In the described embodiment, the chamber 40 is a microwave generated plasma chamber. Alternatively, any one of a number of other appropriate known devices for exciting gases remotely can be used. For example, the generator can be implemented by a plasma flame spray gun which uses high powered electrostatic discharge to excite the gas flowing through it or it can be an RF plasma source or it can be a high temperature flame source, just to name a few other possibilities. A programmed controller 57 controls and coordinates the operation of chamber 40, vacuum pump 24, pulse valve 44 and heater 26 to achieve the desired processing.

A dielectric layer is then formed by deposition and annealing. The dielectric layer may be composed of any high-K dielectric material, including but not limited to BT, Ta$_2$O$_5$, HfO, PZT, SBT, SRO, ZnO, ZrO, and CeO, and generally dielectrics comprising binary metals and perovskite oxides. With respect to the present invention, the dielectric material is preferably BST. The present method provides a two step process for the deposition of BST, as will be described in more detail below.

Following deposition and annealing of the dielectric layer, a second electrode is created over the dielectric layer, as described above for the top electrode. The top electrode is then optionally patterned (e.g., by lithography) and/or etched using techniques known in the art. Following this, the MIM structures are stack annealed using processes such as rapid thermal processing, rapid thermal oxidation, remote plasma annealing and the like.

Deposition and Annealing of the Dielectric Layer

The present invention provides in part a method for depositing and annealing of a high-K dielectric material, and in particular BST, onto a substrate in a manner that allows adequate step coverage while maintaining the proper BST crystal structure. Specifically, the two step process of low temperature (500° C. or less) deposition of BST followed by high temperature post-deposition annealing provides favorable BST crystallization and step coverage in a cost effective manner.

The dielectric is preferably deposited in a thickness ranging from about 50 Å to about 1000 Å, with a more preferred thickness in the range of from about 250 to about 350 Å. The dielectric layer is formed using conventional methods of CVD, at a temperature of up to 550° C., more preferably below 500°, and even more preferably from between about 450 to 490° C. The deposition takes place in an oxidizing ambient.

Following deposition, the annealing process is performed at a high temperature to allow proper crystallization of the BST on the substrate. The annealing can take place from about 500° C. to about 800° C., and more preferably between about 650° C. to about 750° C. The annealing process can take place for anywhere from a few seconds to several minutes, but preferably is performed in 2 minute intervals to a total of 6 minutes. The pressure at which annealing takes place can be from about 0.1 Torr to about 1 atm, and more preferably is from 2 Torr to 1 atm. The annealing takes place in an inert, inert/oxygen mixture, or a 100% oxygen ambient. If the deposition takes place in a non-oxidative environment, (e.g., $N_2$), it is generally followed by oxidation of the thin film prior to or during annealing. Annealing of the dielectric layer may take place in any chamber in which a plasma can be generated or to which a remote plasma generator can be attached. In a preferred embodiment, the annealing takes place in an RTP chamber.

Any number of rapid thermal processing devices can be used in the methods of the present invention. For example, rapid thermal heating unit that can be used with the present invention are described in detail in U.S. Pat. Nos. 6,016,383; 5,970,214; 5,951,896; 5,930,456; 5,840,125; 5,790,751; 5,767,486; 5,743,643; 5,708,755; 5,689,614; 5,561,735; and 5,487,127, which are incorporated herein by reference.

EXAMPLES

The following examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed. Efforts have been made to ensure accuracy with respect to numbers used (e.g., amounts, temperature, etc.) but some experimental errors and deviations should be accounted for. Unless indicated otherwise, parts are parts by weight, molecular weight is weight average molecular weight, temperature is in degrees Centigrade, and pressure is at or near atmospheric.

Example 1

A number of different parameters were examined for BST deposition onto substrates. The substrates used were Si wafer with a 2000 Å layer of $THO_x$, a 250 Å layer of $TiO_2$, and a 1000 Å layer of Pt. The BST deposition onto each substrate was carried out at 460° C. wafer temperature at 3 Torr, and a BST layer of approximately 250 Å was deposited on each substrate.

One of three BST annealing protocols was used following BST deposition:
1. Rapid Thermal Processing (RTP) in either an O2 or N2 environment, which was done at either 650° C. or 750° C.;
2. Remote Plasma Oxidation (RPO) followed by RTP;
3. RTP in a non-oxidative environment ($N_2$ crystallization) followed by RPO. In each case, RTP was carried out at 740 Torr for 3 minutes, and RPO was carried out at 475° C. for 3 minutes.

Following annealing a top Pt electrode was deposited and patterned. Stack annealing took place using remote plasma stack anneal at 2.5 Torr in an ambient of 4:10:1 $Ar:O_2:N_2$ and a 500° C. wafer temperature for 2 minutes. The electrical properties of the different BST annealing processes is summarized as follows:

TABLE 1

Electrical Summary

| Split Description | C/A | Electrical Properties | | C/J |
|---|---|---|---|---|
| | | J @ 1.25 V | J @ -1.25 V | |
| $RTO_2$ crystallization 650° C. | 56 ($\sigma$ = 8.9%) | 4.E-08 | 1.E-07 | 56 |
| $RTO_2$ crystallization 750° C. | 73 ($\sigma$ = 4.5%) | 2.E-08 | 3.E-08 | 243 |
| RPO + $RTO_2$ crystallization, 650° C. | 58 ($\sigma$ = 7.7%) | 5.E-08 | 7.E-08 | 83 |
| $RTO_2$ crystallization 650° C. + RPO | 54 ($\sigma$ = 17.3%) | 6.E-08 | 2.E-07 | 27 |
| $RTO_2$ crystallization 750° C. + RPO | 71 ($\sigma$ = 7.3%) | 6.E-08 | 7.E-08 | 101 |
| $RTN_2$ crystallization 650° C. + RPO | 53 ($\sigma$ = 14.3%) | 2.E-08 | 2.E-08 | 265 |
| $RTN_2$ crystallization 750° C. + RPO | 75 ($\sigma$ = 3.6%) | 3.E-08 | 7.E-08 | 107 |

Figure 2:
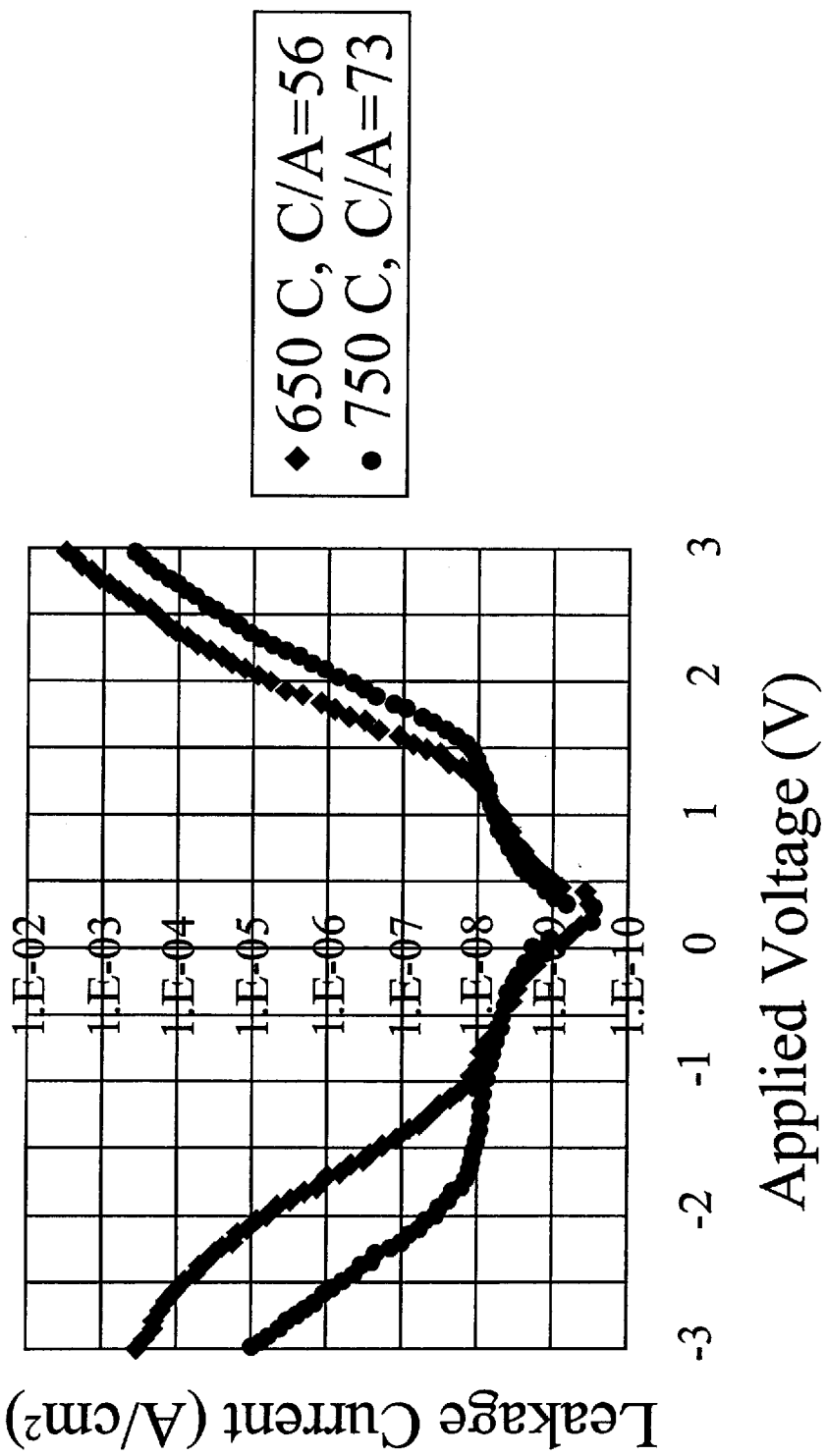
FIGS. 2–4 illustrate the leakage currents using different BST annealing parameters.
Figure 3:
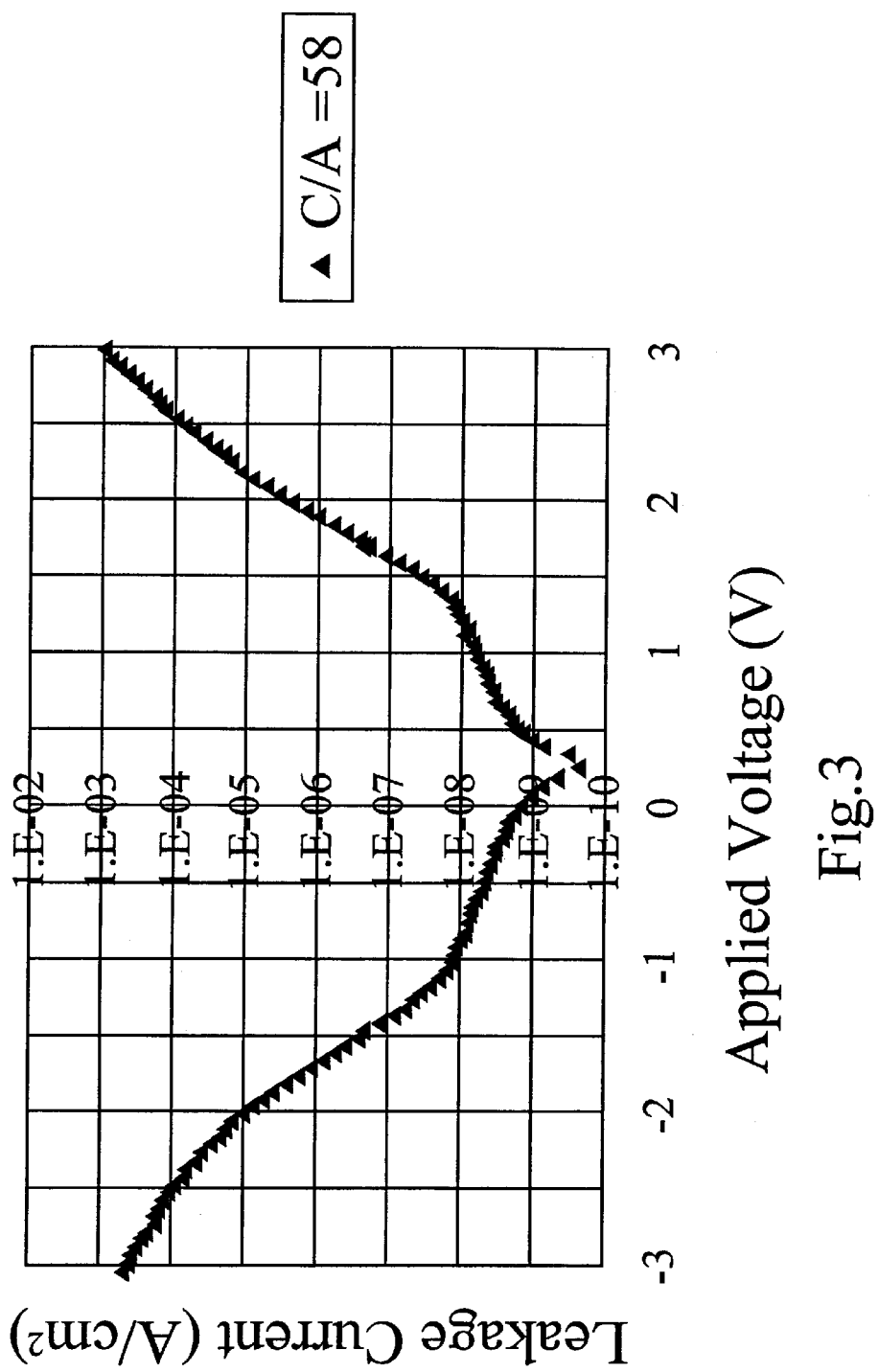
Figure 4:
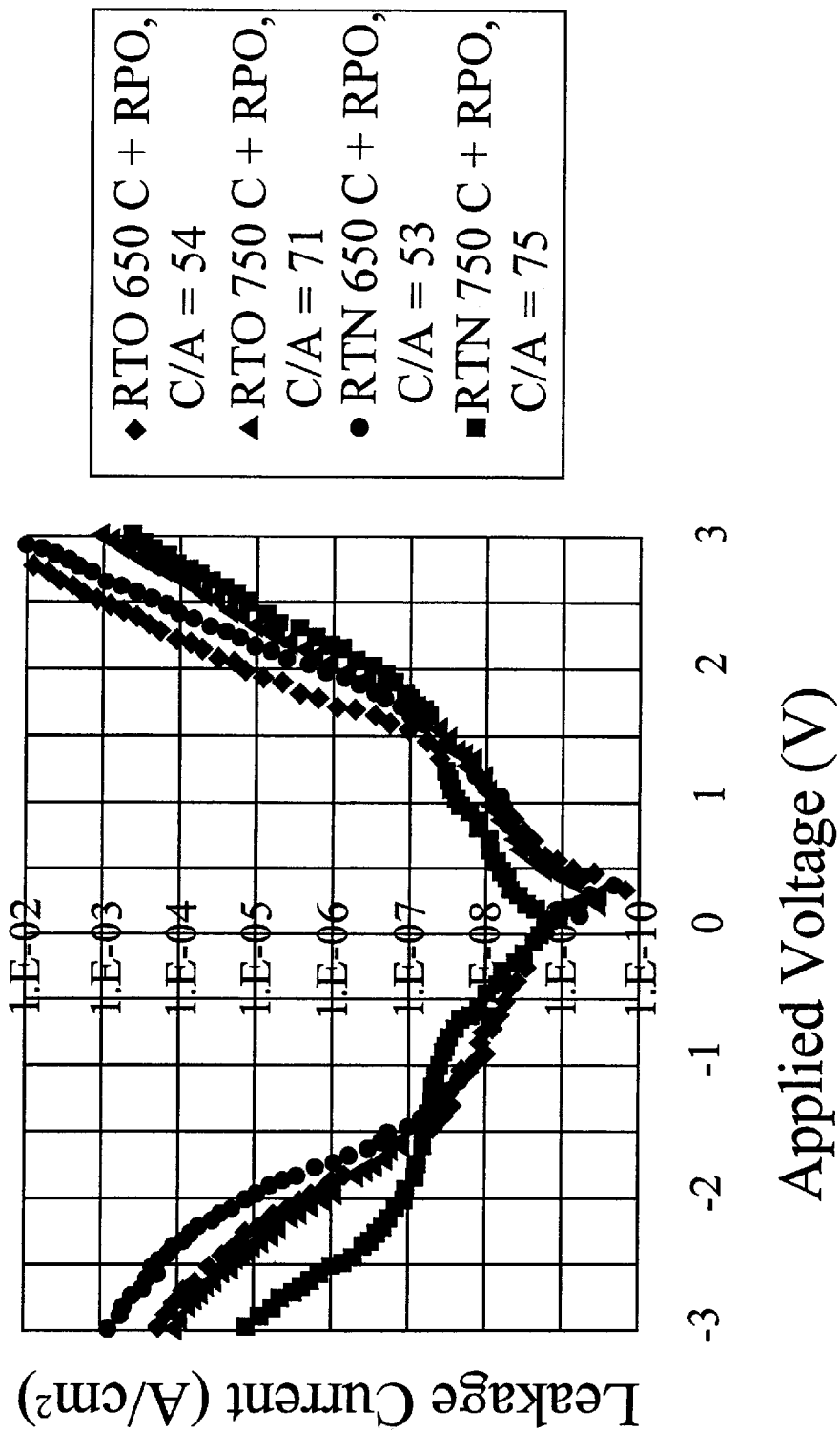

Leakage currents shown are geometric averages of 9 points. The leakage current at varied voltages are illustrated in FIGS. 2–4.

Figure 5:
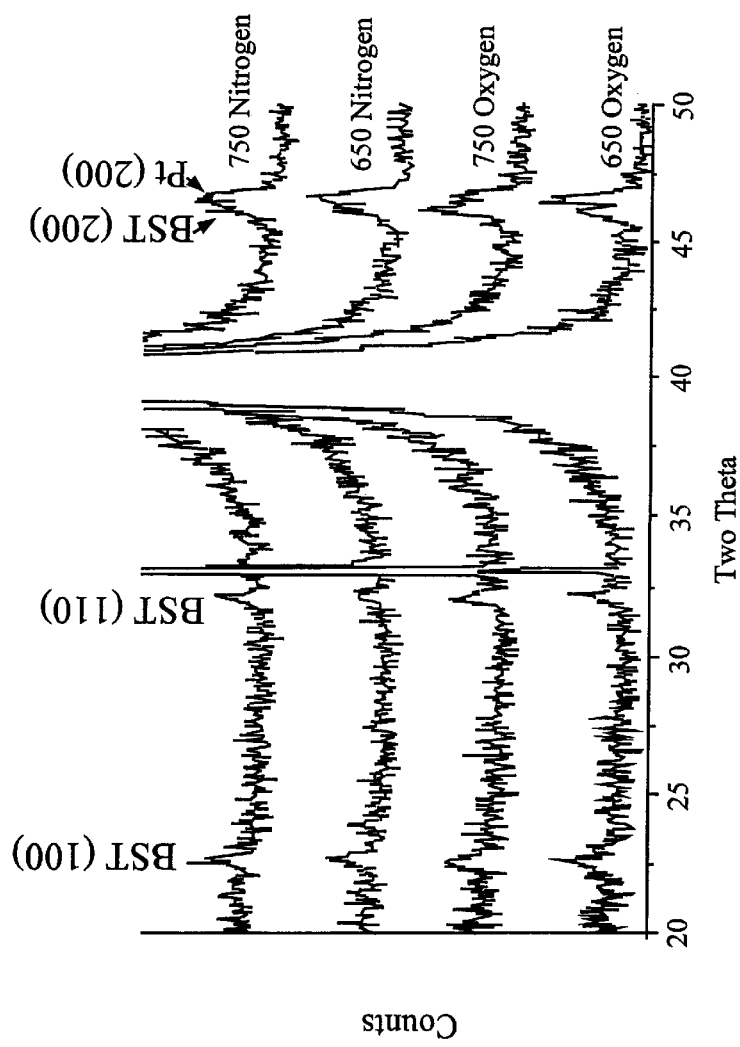
FIG. 5 illustrates XRD results from representative low temperature BST depositions using various annealing conditions.

FIG. 5 illustrates the crystallization achieved using RTP annealing at 650° C. and 750° C. in both an $O_2$ environment and an $N_2$ environment. As can be seen from the data, the process produces favorable results with both high temperature annealing in an oxidative environment and high temperature annealing in a non-oxidative environment followed by RPO.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

That which is claimed is:

1. A process for forming a dielectric layer on a surface, comprising the steps of:
  a) depositing a layer of a high-K dielectric material over a surface, wherein the deposition occurs at a temperature of less than 500° C. and in a non-oxidative environment;
  b) oxidizing the layer; and
  c) annealing the dielectric layer to the surface using a high temperature post-deposition annealing process;
    wherein the process results in a dielectric layer characterized by substantially even coverage of the surface and a crystal structure characterized by having a high dielectric constant.

2. The process of claim 1, wherein the dielectric material comprises a material selected from the group consisting of BT, $Ta_2O_5$, $HfO_2$, PZT, SBT, SRO, ZnO, $ZrO_2$, and $CeO_2$.

3. The process of claim 1, wherein the dielectric material comprises BST.

4. The process of claim 1, wherein the high temperature post-deposition annealing process is carried out within a temperature range of about 500° C. to about 800° C.

5. The process of claim 4, wherein the high temperature post-deposition annealing process is carried out within a temperature range of about 600° C. to about 750° C.

6. The process of claim 5, wherein the high temperature post-deposition annealing process is carried out within a temperature range of about 650° C. to about 750° C.

7. The process of claim 1, wherein the surface comprises silicon.

8. The process of claim 7, wherein the surface further comprises an electrode, and wherein said electrode is comprised of a metal selected from the group consisting of platinum, ruthenium, and iridium.

9. The process of claim 1, wherein the dielectric material is annealed to the surface by remote plasma annealing.

10. The process of claim 1, wherein the oxidation is carried out by remote plasma oxidation.

11. A method of fabricating a MIM DRAM capacitor, comprising the steps of:
   depositing a first metal layer onto a substrate and annealing the first metal to the substrate;
   depositing a high-K dielectric material over a surface, wherein the deposition of the dielectric material occurs at a temperature of less than 500° C. and annealing of the dielectric material to the surface occurs at a temperature of at least 650° C.; and
   depositing a second metal layer onto the dielectric material.

12. A process for forming a dielectric layer on a surface, comprising the steps of:
   a) depositing a layer of BST over a surface, wherein the deposition occurs at a temperature of less than 500° C.; and
   b) annealing the BST layer to the surface using a remoteplasma annealing process at a temperature greater than 500° C.;
      wherein the process results in a dielectric layer characterized by substantially even coverage of the surface and a crystal structure characterized by having a high dielectric constant.

13. A process for forming a dielectric layer on a surface, comprising the steps of:
   a) depositing a layer of a high-K dielectric material over a surface, wherein the deposition occurs at a temperature of less than 500° C.; and
   b) annealing the dielectric layer to the surface using remote plasma annealing at a temperature of about 500° C. to about 800° C.;
      wherein the process results in a dielectric layer characterized by substantially even coverage of the surface and a crystal structure characterized by having a high dielectric constant.

* * * * *